United States Patent
Toya

(10) Patent No.: US 7,233,023 B2
(45) Date of Patent: Jun. 19, 2007

(54) ELECTRO-OPTICAL DEVICE, DRIVING CIRCUIT, AND ELECTRONIC APPARATUS

(75) Inventor: Takashi Toya, Shimosuwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/008,998

(22) Filed: Dec. 13, 2004

(65) Prior Publication Data
US 2005/0127369 A1    Jun. 16, 2005

(30) Foreign Application Priority Data
Dec. 15, 2003  (JP)  ............................. 2003-417319

(51) Int. Cl.
*H01L 29/15*  (2006.01)
*G02F 1/136*  (2006.01)
(52) U.S. Cl. ........................ 257/72; 257/59; 257/350
(58) Field of Classification Search ................ 257/72, 257/59, 350; 349/43
See application file for complete search history.

(56) References Cited

U.S. PATENT DOCUMENTS

| | | | | |
|---|---|---|---|---|
| 5,426,320 A | * | 6/1995 | Zambrano | 257/328 |
| 6,333,520 B1 | * | 12/2001 | Inoue | 257/72 |
| 6,677,609 B2 | * | 1/2004 | Inoue | 257/59 |
| 6,790,755 B2 | * | 9/2004 | Jeon | 438/591 |
| 7,038,279 B2 | * | 5/2006 | Kraz et al. | 257/355 |
| 2002/0047550 A1 | * | 4/2002 | Tanada | 315/155 |
| 2003/0103181 A1 | * | 6/2003 | Imayama et al. | 349/122 |

* cited by examiner

*Primary Examiner*—Long K. Tran
(74) *Attorney, Agent, or Firm*—Oliff & Berridge PLC

(57) ABSTRACT

To prevent an electrostatic discharge in transistors constituting a driving circuit built in a substrate. The shift register and the level shifter constituting a scanning line driving circuit include TFT elements respectively which employing the polysilicon layer formed on the element substrate as a semiconductor layer. Each TFT element constituting the level shifter has a gate electrode opposing the channel region of the polysilicon layer with an insulating layer interposed therebetween. Each polysilicon layer is shared by a plurality of TFT elements with being separated from each other. The total area 'S' of each polysilicon layer which opposes the gate electrode of the TFT element is 3000 μm² or less.

7 Claims, 6 Drawing Sheets

ELECTRO-OPTICAL DEVICE, DRIVING CIRCUIT, AND ELECTRONIC APPARATUS

BACKGROUND

This invention relates to a technology for displaying a picture using various kinds of electro-optical elements, such as a liquid crystal and an OLED (Organic Light-Emitting Diode) element.

An electro-optical device, such as a liquid crystal device, has a plurality of pixels arranged on the surface of a substrate having an insulating property, and a driving circuit for supplying a driving signal to these pixels. Further, a structure has been proposed where a transistor constituting a driving circuit is formed on the surface of a substrate by SOI (Silicon On Insulator) technology. This kind of electro-optical device is called a driver built-in type electro-optical device, and has various advantages such as reduced manufacture cost, compared to the electro-optical device whose IC chip including a driving circuit is mounted on the substrate. In a driver built-in type electro-optical device, a polysilicon layer is employed as a semiconductor layer for each transistor constituting a driving circuit.

SUMMARY

On the other hand, in order to meet to the demand for a display picture having high definition, a pixel pitch should be small, and at the same time, the interval between transistors of the driving circuit built in the substrate also should be small. In order to accomplish this in a driver built-in type electro-optical device, a structure is proposed where a plurality of gate electrodes are formed to oppose one polysilicon layer so that each polysilicon layer can be shared by a plurality of transistors. Compared to a structure where a plurality of polysilicon layer is formed for each transistor while being separated from each other, this structure makes it possible to minimize the size of intervals between transistors.

However, when one polysilicon layer is shared by a plurality of transistors, the total area of a region of the one polysilicon layer which opposes the gate electrodes (namely, 'the area of a region of one polysilicon layer opposing one gate electrode'×'the number of the transistor sharing one polysilicon layer') is larger than that of the structure where one polysilicon layer is independently formed for one transistor. The inventors of the present invention have discovered that as the total area (hereinafter, referred to as a gate covered total area) becomes larger, the capacitance between the polysilicon layer and the gate electrode increases and an electric charge may be easily accumulated, which increases the possibility of electro-static discharge in transistors. This invention is made in consideration of the problems, and an object of the present invention is, by employing a simple structure, to prevent an electro-static discharge from occurring in transistors constituting the driving circuit built in the substrate.

In order to accomplish the object, the present invention provides a structure capable of decreasing the gate covered total area of one polysilicon layer. According to experiments made by the inventors of the present invention, when the gate covered total area in one polysilicon layer exceeds 3000 $\mu m^2$, the possibility of an electrostatic discharge in each transistor sharing the polysilicon layer increases. In this respect, a first aspect of an electro-optical device according to the present invention includes a driving circuit for generating, using a plurality of transistors formed on the surface of a substrate, a driving signal for driving each of a plurality of pixels. Here, each of the plurality of transistors has a gate electrode opposing a channel region of a polysilicon layer with an insulating layer interposed therebetween. The channel regions of the polysilicon layers are separated from each other, in at least one of the transistors. And of the channel regions of the polysilicon layers which oppose the gate electrode of the at least one of the transistors is 3000 $\mu m^2$ or less. According to this structure, since the gate covered total area in one polysilicon layer is 3000 $\mu m^2$ or less, the possibility of the electrostatic discharge in one or more transistors employing the polysilicon layer as a semiconductor layer decreases.

In addition, the driving circuit according to the present invention drives a pixel responding to input of a driving signal (a scanning signal or a data signal) and more specifically, includes a scanning line driving circuit for sequentially supplying a scanning signal to each scanning line to which pixels arranged in a row direction are commonly connected, and a data line driving circuit for sequentially supplying a data signal corresponding to a display picture to each data line to which pixels arranged in the column direction are commonly connected. Here, the voltage amplitude of the scanning signal output from a scanning line driving circuit is generally larger than that of the voltage amplitude of the data signal output from a data line driving circuit. For this reason, the possibility of the electrostatic discharge in each transistor constituting a scanning line driving circuit is higher than a possibility of the electrostatic discharge in each transistor constituting a data line driving circuit. Therefore, the first aspect of the present invention can be suitably adopted for a scanning line driving circuit of an electro-optical device.

For decreasing the gate covered total area on one polysilicon layer, a structure can be considered where the number of the transistor formed on one polysilicon layer (namely, the number of the gate electrode opposing a single polysilicon layer) decreases, or the overlapping area between the polysilicon layer and one gate electrode decreases. Moreover, in order to prevent an electro-static discharge from occurring in each transistor, it is desirable to set a thickness of the insulating layer in a range of 50 nm to 100 nm, and to make the insulating layer have a dielectric constant of 4 or less.

The possibility of the electrostatic discharge in each transistor constituting a driving circuit tends to increase as the potential difference inside the circuit becomes larger. Therefore, among circuits constituting a driving circuit, a circuit for processing a signal with larger voltage amplitude (difference between the high level signal and the low level signal) has a higher possibility of the electrostatic discharge in each transistor. On the other hand, the voltage amplitude of a driving signal for driving a pixel (hereinafter, referred to as 'driving level'), i.e., the difference between the maximum level and the minimum level, is usually larger than the difference between the high level and the low level of a logic level signal. Therefore, between circuits constituting a driving circuit, there is a high necessity to decrease the gate covered total area of one polysilicon layer especially in the circuit for processing a driving level signal. As a circuit of an electro-optical device for processing a driving level signal, a level shift circuit can be exemplified which generates a driving signal based on a logic level signal, and then outputs it to each pixel. According to a desirable aspect of the present invention, the gate covered total area of one polysilicon layer in a level shift circuit is 3000 $\mu m^2$ or less. In detail, as a specific structure of the level shift circuit, a structure may be adopted where m (m is a natural number equal to or greater than 2) unit circuits are arranged in the pixel arrangement direction. In the above-mentioned structure, it is desirable that the polysilicon layers in the level shift circuit are separated from each other and provided in every block. Each m number of circuits are divided into blocks that each includes two or more circuits, but less than or equal to m/2 circuits. That is, when m unit circuits are divided into 2 or more blocks, it is desirable for one polysilicon layer to be commonly shared by the transistors constituting each block. For example, when m unit circuits are divided into two blocks, two polysilicon layers are prepared for m unit circuits and each polysilicon layer is commonly shared by the transistors constituting m/2 unit circuits. Next, when m unit circuits are divided into m/2 or less blocks, it is desirable for one polysilicon layer to be shared by the transistor constituting each block. For example, when m unit circuits are divided into m/2 blocks, m/2 polysilicon layers are prepared for m unit circuits and each polysilicon layer is commonly shared by the transistors consisting two unit circuits.

On the other hand, as a driving circuit for sequentially supplying a driving signal to a plurality of pixels, a circuit with a shift register circuit and a level shift circuit may be adopted. The shift register circuit sequentially shifts a specific pulse signal in accordance with a clock signal, and then outputs it, and the level shift circuit generates a signal (more specifically, a driving level signal) whose voltage amplitude is larger than the output signal from a shift register circuit, and then outputs it to each pixel as a driving signal. As a switching element for the shift register circuit or the level shift circuit, a transistor built in the substrate can be adopted. Here, while a pulse signal or a clock signal subject to processing by the shift register circuit is a logic level signal and thus its voltage amplitude is small, a driving signal subject to processing by the level shift circuit is a driving level signal and thus its voltage amplitude is large. Therefore, comparing the shift register circuit to the level shift circuit, it can be said that transistors in the level shift circuit has a higher possibility of the electrostatic discharge. In this respect, in a second aspect of the electro-optical device according to the present invention, the total area of the channel regions of each polysilicon layer which opposes the gate electrode of at least one of transistors in the level shift circuit is smaller than the total area of the channel regions of each polysilicon layer which opposes the gate electrode of the at least one transistor in the shift register circuit. According to this structure, electrostatic discharge of the transistor in the level shift circuit can be prevented effectively, and at the same time, the gate covered total area of the shift register circuit may be suitably selected so that operation reliability can be guaranteed. In addition, like as the above-mentioned first aspect, for an electro-optical device according to the second aspect, it is desirable to set the gate covered total area of each polysilicon layer disposed in a level shift circuit to 3000 $\mu m^2$ or less.

An electro-optical device according to the above-mentioned the first or second aspect may be used as a display means for an electric apparatus. According to the above-mentioned electro-optical device of the present invention, since the electrostatic discharge in the transistor constituting a driving circuit can be prevented, the reliability of the electric apparatus employing this device can be improved.

This invention may be also applied to a driving circuit according to the first or second aspect. Specifically, a driving circuit according to the first aspect is a circuit which generates, using a plurality of transistors formed on the surface of a substrate, a driving signal for driving each of a plurality of pixels of an electro-optical device, each of the plurality of transistors has a gate electrode opposing a channel region of a polysilicon layer with an insulating layer interposed therebetween, the channel regions of the transistors are separated from each other, in at least one of the transistors, and the total area of the channel regions of the polysilicon layers which oppose the gate electrodes of at least one transistor is 3000 $\mu m^2$ or less. Next, a driving circuit according to the second aspect is a circuit which generates a driving signal for driving each of a plurality of pixels of an electro-optical device. The driving circuit has a shift register circuit which sequentially shifts a pulse signal in accordance with a clock signal by using a plurality of transistors formed on the surface of a substrate and outputs the pulse signal and a level shift circuit which generates, by using the plurality of transistors formed on the surface of the substrate, a signal with a larger voltage amplitude than that of the output signal from the shift register circuit and then outputs it as a driving signal to each pixel. Each transistor in the shift register circuit and in the level shift circuit respectively has a gate electrode opposing the channel region of a polysilicon layer with an insulating layer interposed therebetween, the channel regions of the transistors are separated from each other, in at least one of the transistors. The total area of the channel regions of the polysilicon layers opposing the gate electrodes of the at least one transistor formed on each polysilicon layer in the level shift circuit is smaller than the total area of the regions of the polysilicon layers opposing the gate electrodes of the at least one transistor formed on each polysilicon layer in the shift register circuit. By the same reason as the electro-optical device according to this invention, the driving circuit having this structure also can prevent an electrostatic discharge in the transistor constituting a driving circuit built in the substrate by employing a simple structure.

DETAILED DESCRIPTION OF EMBODIMENTS

A: First Embodiment

First, a liquid crystal device employing a liquid crystal as an electro-optical substance will be described below. This liquid crystal device is a means for displaying various pictures by a plurality of pixels planarly arranged, and has a liquid crystal sealed between an element substrate 41 shown in FIG. 1, and an opposite substrate not shown. On the surface of the opposite substrate which faces the liquid crystal, an opposite electrode is formed and a substantially constant common potential is applied to the opposite electrode.

Figure 1:
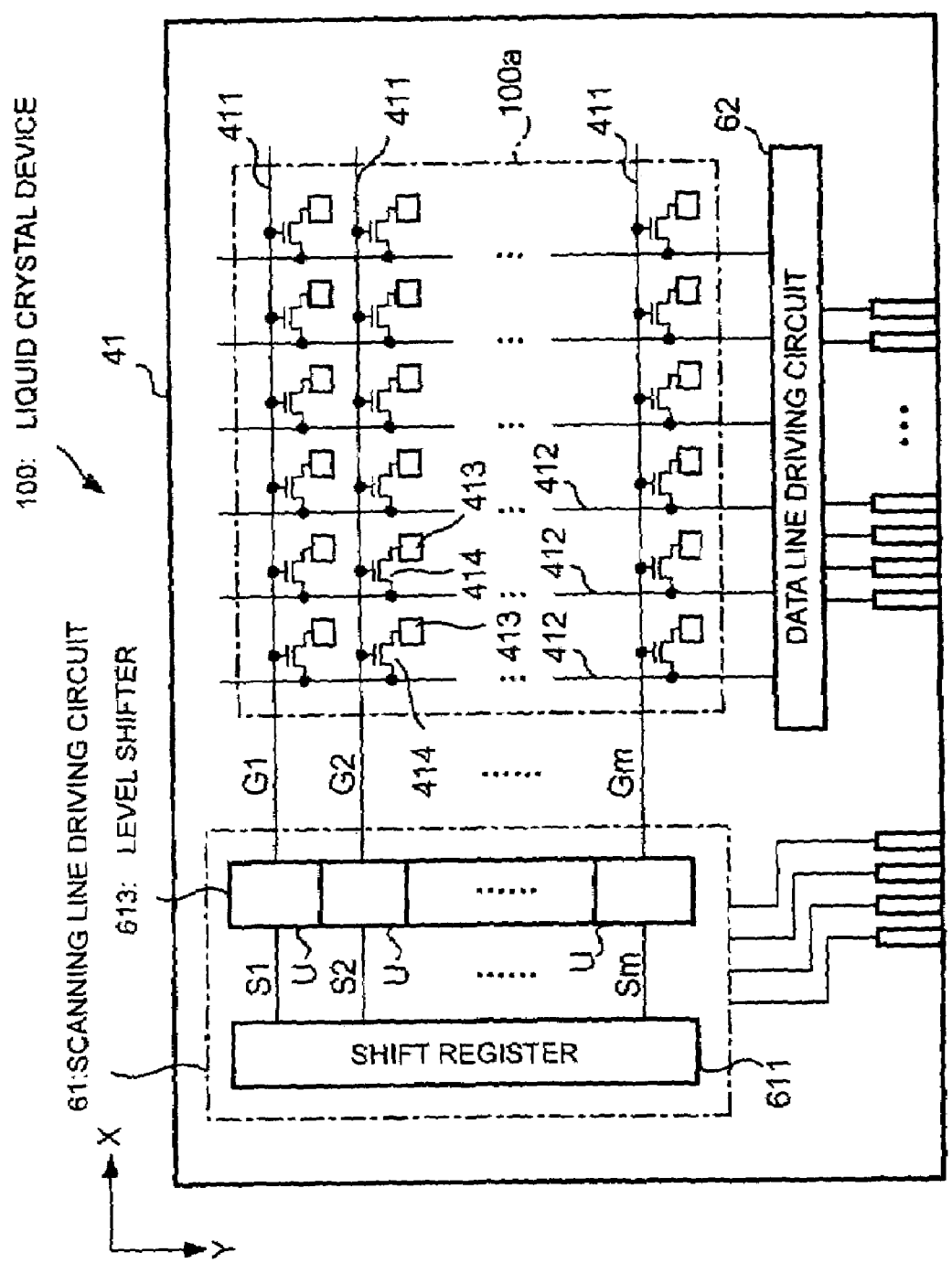
FIG. 1 is a block diagram showing a structure on an element substrate constituting a liquid crystal device according to a first embodiment of the present invention.

On the other hand, on the surface of the element substrate 41 which faces the liquid crystal, m scanning lines 411 (m is a natural number equal to or greater than 2) are arranged in the X direction, and n data lines 412 (n is a natural number equal to or greater than 2) are arranged in the Y direction. Furthermore, as shown in FIG. 1, at each intersection of the plurality of scanning lines 411 and the plurality of data lines 412, pixel electrodes 413 are formed. Each pixel electrode 413 is a rectangular shaped electrode which faces the opposite electrode with the liquid crystal interposed therebetween, and is electrically connected to a drain of TFT 414 (hereinafter, referred to as a 'pixel controlling TFT element') arranged at the intersection of the scanning line 411 and the data line 412. As for each pixel controlling TFT element 414, its gate is connected to a scanning line 411 and its source is connected to the data line 412. Therefore, the pixel comprising the pixel electrode 413, the opposite electrode, and the liquid crystal interposed between the both electrodes is arranged in a shape of a matrix in display region 100a over X and Y directions.

Figure 2:
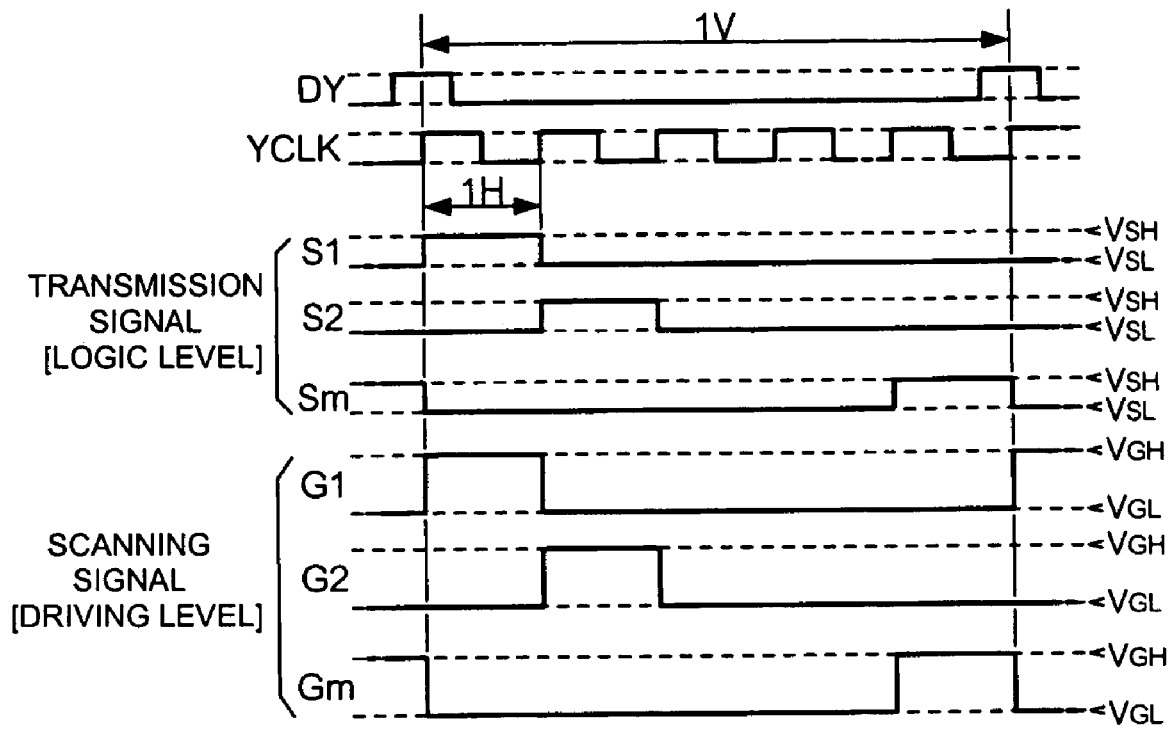
FIG. 2 is a timing chart showing an operation of a liquid crystal device.
Figure 3:
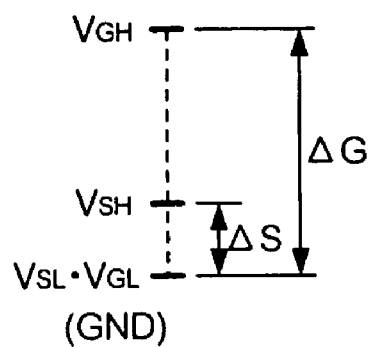
FIG. 3 is a view showing the relation between a logic level and a drive level.

Each of these pixels is subject to driving by a scanning line driving circuit 61 and a data line driving circuit 62. The scanning line driving circuit 61 sequentially selects each of m scanning lines 411. More specifically, the scanning line driving circuit 61 has a shift register 611 and a level shifter 613, as shown in FIG. 1. As shown in FIG. 2, the shift register 611 sequentially shifts the transmission starting pulse DY supplied at the beginning of each vertical scanning period (1V), in accordance with the clock signal (YCLK) with a cycle equivalent to one horizontal scanning period (1H) and transmits transmission signals S1, S2, . . . , Sm. Each transmission signal Si (i is a natural number between 1 and m) is a logic level signal. That is, as shown in FIG. 3, each transmission signal Si has a voltage VSH at H level, and a voltage VSL (it is the same as the low level potential GND of a power supply) at L level. On the other hand, the level shifter 613 shown in FIG. 1 changes the level of the transmission signals S1, S2, . . . , Sm output from the shift register 611 into the driving level and then outputs them as scanning signals G1, G2, . . . , GM. As shown in FIG. 2, the scanning signals, G1, G2, . . . , Gm supplied to each of m scanning lines 411 are supposed to sequentially have H level (active level) for every horizontal scanning period. When the scanning signal Gi (i is a natural number between 1 and m) supplied to each scanning line 411 are switched into an active level, a group of pixel controlling TFT elements 414 belong to one line connected to the scanning line 411 are turned ON at once. As shown in FIG. 3, each scanning signal Gi has the voltage VGH obtained by switching the 'pixel controlling TFT element' 414 into ON state at H level and has voltage VGL (it is the same as the low level potential GND of a power supply) at L level, respectively. As shown in the same figure, the voltage amplitude $\Delta G$ (namely, potential difference between H level voltage VGH and L level voltage VGL) of the scanning signal Gi is larger than the voltage amplitude $\Delta S$ (namely, potential difference between H level voltage VSH and L level voltage VSL) of the transmission signal Si.

On the other hand, the data line driving circuit 62 shown in FIG. 1 supplies the data signal with a voltage corresponding to a display picture into the pixel electrodes 413 from the respective data lines 412. More specifically, during the period of the pixel controlling TFT element 414 being ON state in one horizontal scanning period, the data line driving circuit 62 sequentially samples the picture signals for pixels belong to one line which is supplied from upper level device to data line 412. This data line driving circuit 62 includes a shift register and a sampling circuit (both are not shown in FIG. 1). The shift register shifts a pulse signal supplied at the beginning of each horizontal scanning period in accordance with a clock signal. The sampling circuit samples a picture signal in accordance with the signal output from the shift register.

The liquid crystal device 100 according to an embodiment of the present invention is driver built-in type liquid crystal device in which the transistor (hereinafter referred to as 'TFT element') constituting the scanning line driving circuit 61 and the data line driving circuit 62 are directly mounted on the surface of the element substrate 41. This TFT element employs a polysilicon layer as a semiconductor layer. An electrostatic discharge in TFT elements is a major problem for a driving circuit used for such kind of liquid crystal device 100, especially for the circuit which processes the signals with a relatively high voltage amplitude. As mentioned above, in the present embodiment, the level difference (voltage amplitude) $\Delta G$ of the scanning signal Gi output from the level shifter 613 is relatively larger compared to other signals, such as the transmission signal Si. For this reason, this embodiment employs the structure capable of decreasing the gate covered total area of each polysilicon layer for the TFT elements of the level shifter 613. The structure of this level shifter 613 will be described below in detail.

Figure 4:
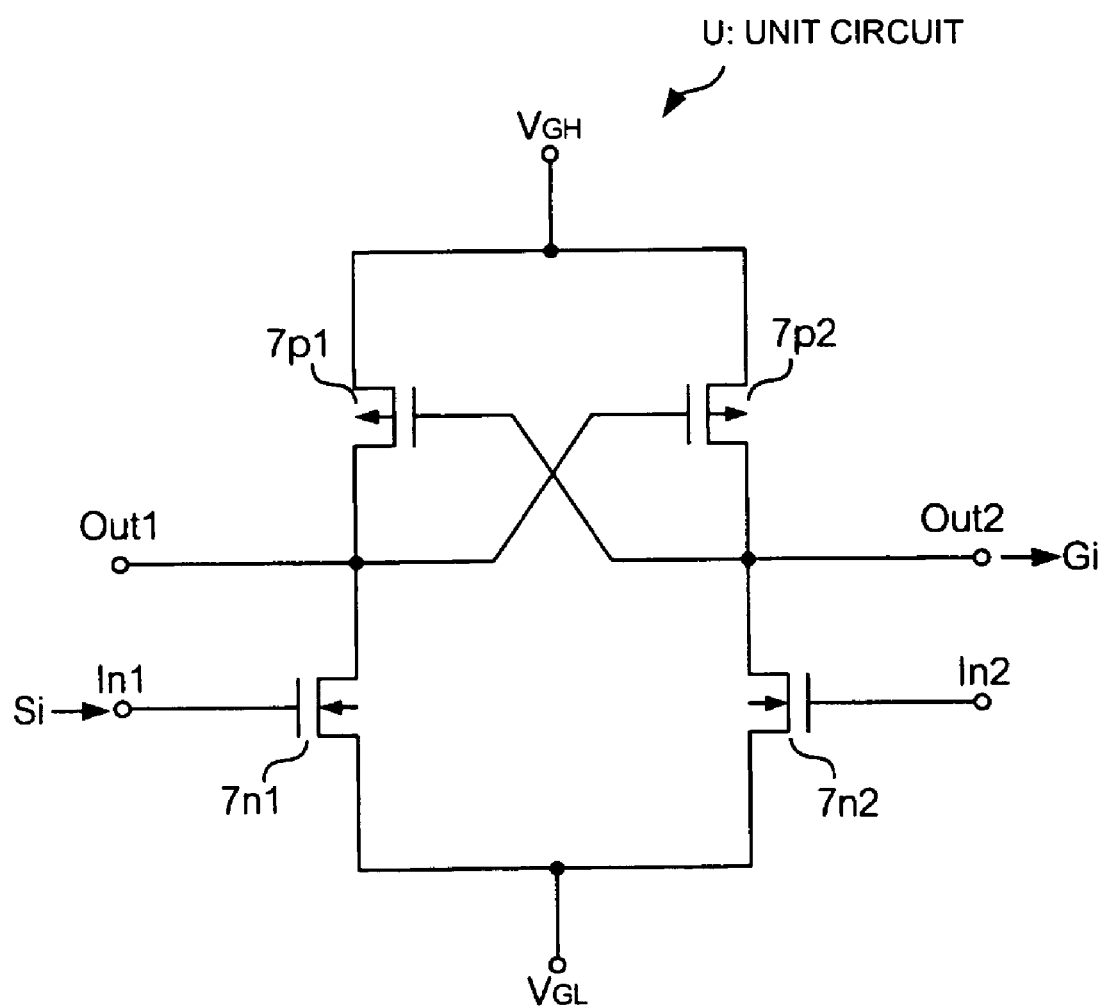
FIG. 4 is a circuit diagram showing the structure of a unit circuit U constituting a level shifter.

As shown in FIG. 1, the level shifter 613 has m unit circuits U of m stage corresponding to the total number of the scanning line 411 are arranged in the Y direction. The i-th unit circuit U from the upper side in FIG. 1 outputs a scanning signal Gi which is obtained by changing the level of the transmission signal Si output from the shift register 611 into the driving level with a much larger voltage amplitude and its specific structure is shown in FIG. 4. In FIG. 4, only the structure of the i-th stage unit circuit U is shown but the other unit circuits U has also the same structure.

As shown in FIG. 4, the unit circuit U has two p channel type TFT elements 7p1 and 7p2, and two n channel type TFT elements 7n1 and 7n2. These 7n1, 7n2, 7p1 and 7p2 are a MOS transistors employing a polysilicon layer 71 as a semiconductor layer. Here, TFT elements 7p1 and 7n1 are connected in series each other and located between the high level potential VGH and the low level potential VGL of a power supply. Similarly, 7p2 and 7n2 are also connected in series each other and located between the high level potential VGH and the low level potential VGL of a power supply. The gate of the TFT element 7n1 is connected to an input terminal In1 to which the transmission signal Si output from the shift register 611 is supplied. On the other hand, the gate of the TFT element 7n2 is connected to an input terminal In2 to which a signal with a reverse level to the transmission signal Si is supplied. Moreover, the gate of the TFT element 7p1 is connected, via the contact point of the TFT elements 7p2 and 7n2, to an output terminal Out2 through which the scanning signal Gi is output. Similarly, the gate of the TFT element 7p2 is connected, via the contact point of the TFT element 7p1 and 7n1, to an output terminal Out1 through which a signal with a reverse level to the scanning signal Gi is outputted. According to this structure, when the transmission signal Si supplied to the input terminal In1 has L level (voltage VSL), the gate of the TFT element 7n2 becomes H level which is a reverse level to the transmission signal Si, and the TFT element 7n2 comes to be ON state. Thus, the scanning signal Gi output to the output terminal Out2 becomes L level (voltage VGL). On the other hand, when i-th row scanning line 411 is selected during a horizontal scanning period and thus the transmission signal Si supplied into the input terminal In1 changes into H level (Voltage VSH), the TFT element 7n1 turns ON state, the output terminal Out1 comes to be L level and the TFT element 7p2 connected to the output terminal Out1 turns ON state. As a result, the scanning signal Gi output to the output terminal Out2 comes to be H level (voltage VGH).

Figure 5:
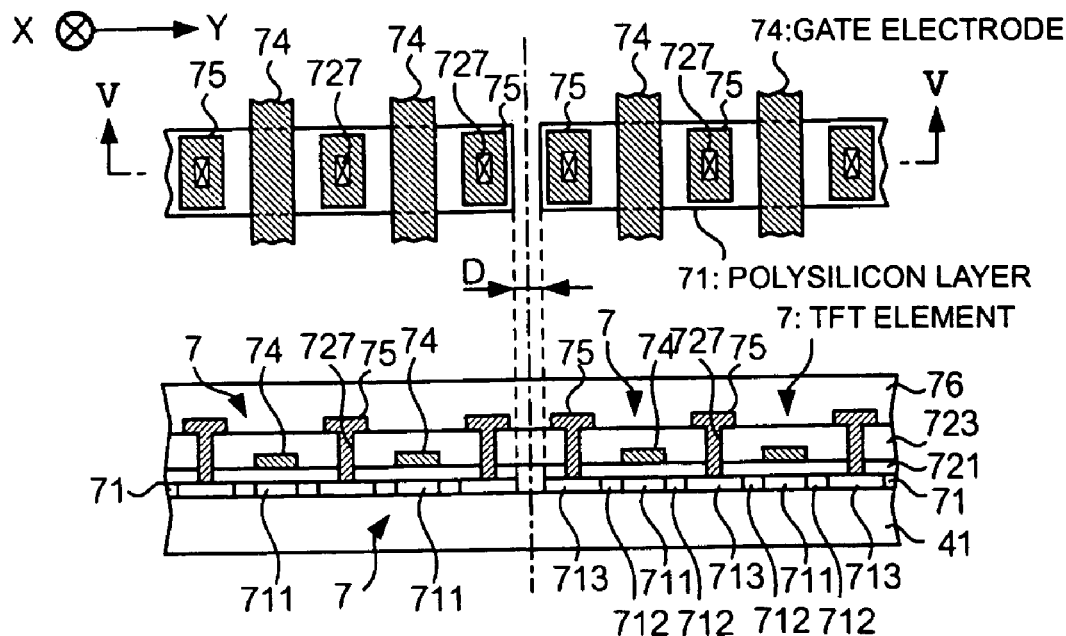
FIG. 5 is a plane view and a sectional view showing a structure of a TFT element.

Next, with reference to FIG. 5, the specific structure of each TFT element 7 (the TFT element 7p1, 7p2, 7n1, and 7n2) constituting the level shifter 613 will be described below. The lower side figure shown in FIG. 5 is a sectional view taken along a line V—V of the plane view of the upper side figure. However, in the plane view of FIG. 5, just the positional relationship among a polysilicon layer 71, a gate electrode 74, and source/drain electrode 75 which are shown in the sectional view is shown.

In FIG. 5, the one-dot-chain line drawn in the perpendicular direction shows the boundary between the unit circuits U. That is, FIG. 5 shows two TFT elements 7 formed in one unit circuit U and two TFT elements 7 formed in its neighboring unit circuit U. As shown in this figure, a plurality of TFT elements 7 in each unit circuit U is arranged in Y direction. Each TFT element 7 has a gate electrode 74 opposing the channel region 711 of the polysilicon layer 71 with an insulating layer 721 interposed therebetween. The polysilicon layer 71 is formed on the surface of the substrate 41 and, for example, can be formed by performing a laser annealing process onto an amorphous silicon layer formed on the surface of the element substrate 41. In fact, the polysilicon layer 71 is formed on the surface of a thin film, such as SiO$_2$, covering the surface of the element substrate 41, but such structure is not shown in FIG. 5.

The polysilicon layer 71 is formed for every unit circuit U, with being separated from each other. According to FIG. 5, the polysilicon layers 71 constituting the TFT elements 7 of respective unit circuits U are separated from each other with an interval D therebetween. Each polysilicon layer 71 is shared by four TFT elements 7 constituting one unit circuit U as a semiconductor layer. Specifically, on the polysilicon layer 71 for each TFT element, a channel region 711 is formed, and a LDD (Lightly Doped Drain) region 712 and source/drain regions 713 are formed with the channel region 711 interposed therebetween. In addition, neighboring TFT elements 7 share the source/drain region 713. Compared to a structure where one polysilicon layer 71 is formed independently for every TFT element 7, the above-mentioned structure where one polysilicon layer 71 is shared by a plurality of TFT element 7 can decrease the pitch of each TFT element 7.

The insulating layer 721 covers entire surface of the element substrate 41 on which the polysilicon layer 71 is formed. The insulating layer 721 is formed with a thickness between 50 nm and 100 nm using an insulating material whose dielectric constant is 4 or less. The gate electrode 74 is formed to oppose the channel region 711 of the polysilicon layer 71 with the insulating layer 721 interposed therebetween. Each gate electrode 74 is arranged in X direction so as to be perpendicular to the polysilicon layer 71 arranged in X direction. The surface of the insulating layer 721 on which the gate electrode 74 is formed is covered with an interlayer insulating film 723. In the interlayer insulating film 723 and the insulating layer 721 overlaid on the source/drain region 713, a contact hole 727 is formed so as to penetrate the interlayer insulating film and the insulating layer. A source/drain electrode 75 is formed on the surface of the layer insulating film 723 and electrically connected to the source/drain region 713 of the polysilicon layer 71 through the contact hole 727. Therefore, seen from the direction perpendicular to the surface of the element substrate 41, the source/drain electrodes 75 are disposed on the both sides of the gate electrode 74 extended in X direction with the gate electrode 74 interposed therebetween. The surface of the interlayer insulating film 723 on which the source/drain electrodes 75 are formed is covered with a protecting layer 76. The protecting layer 76 protects the TFT elements 7.

Figure 6:
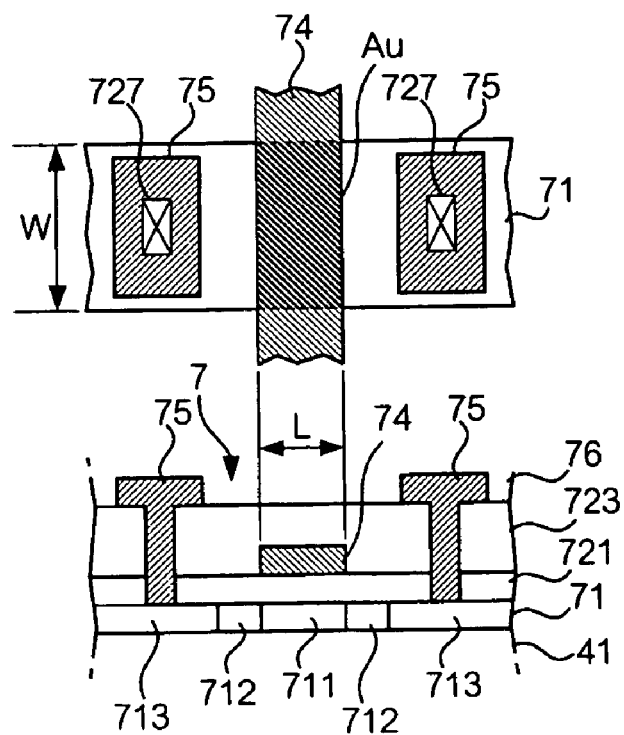
FIG. 6 is an enlarged plane view showing a structure of one TFT element.

Next, FIG. 6 is an enlarged plane view and an enlarged sectional view showing the structure of one TFT element 7. As shown in the plane view, hatched lines which are denser than that of other portions are drawn on a certain portion 'Au', which opposes the gate electrode 74 with the insulating layer 721 interposed therebetween (hereinafter referred to as a gate covered region) of the polysilicon layers 71. According to this embodiment, the shape and the size of the gate electrode 74 or the polysilicon layer 71 are selected so that the total area 'S' (the gate covered total area) of the gate covered region 'Au' in one polysilicon layer 71 becomes 3000 µm$^2$ or less. Here, when the length of the width direction (X direction) of the polysilicon layer 71 is defined to 'W', and the length of the longitudinal direction (Y direction) thereof is defined to 'L', the area 'Su' of one gate covered region 'Au' can be expressed by 'W×L'. Thus, when the number of the TFT element 7 sharing one polysilicon layer 71 is 'k' (in this embodiment, k=4), then the gate covered total area 'S' becomes 'Su×k', i.e., 'W×L×k'. In other words, the shape and the size of the gate electrode 74 or the polysilicon layer 71 should be selected so that the gate covered total area 'S' can be 3000 µm$^2$ or less.

According to the experiments have performed by the inventors of the present invention, when the gate covered total area 'S' of one polysilicon layer 71 exceeds 3000 µm$^2$, each TFT element 7 sharing one polysilicon layer 71 shows a high tendency of an electrostatic discharge. When the gate covered total area 'S' is 3000 µm$^2$ or less as like as this embodiment, the electrostatic discharge in each TFT element 7 can be effectively prevented. Moreover, any other component is not required to be added for preventing an electrostatic discharge in each TFT element 7 except suitably selecting the gate covered total area S. Therefore, this invention has an advantage of making possible to prevent an electrostatic discharge in the TFT element 7 by a very simple structure.

B: Second Embodiment

Next, the structure of a liquid crystal device according to a second embodiment of the present invention will be described. While the first embodiment discloses a structure where the gate covered total area 'S' of each polysilicon layer 71 is 3000 µm$^2$ or less, this second embodiment discloses a structure, in addition to the structural feature of the first embodiment, where the shape and the size of the gate electrode 74 or the polysilicon layer 71 are selected so that the gate covered total area 'S' of a polysilicon layer 71 constituting TFT elements 7 in the level shifter 613 can be smaller than the gate covered total area 'Ss' of a polysilicon layer 71 formed for TFT elements 7 in the shift register 611. In addition, in this embodiment, the same reference numerals are denoted to the same element as described in the first embodiment and the explanation of will be omitted.

Figure 7:
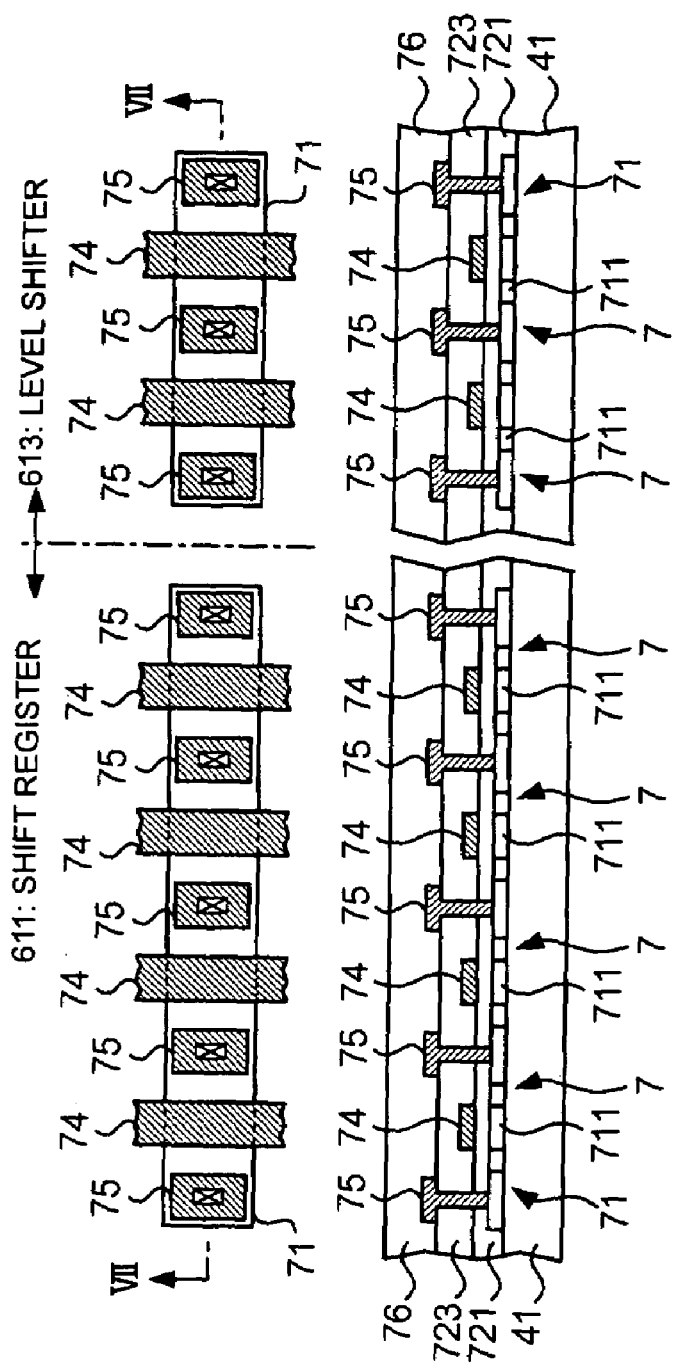
FIG. 7 is a plane view showing the TFT elements constituting a shift register and the TFT elements constituting a level shifter in a liquid crystal device according to the second embodiment of the present invention.

FIG. 7 is a plane view and a sectional view showing TFT elements 7 constituting the level shifter 613 and TFT elements 7 constituting the shift register 611 of a liquid crystal device 100. The figure shown in the lower side is a sectional view taken along a line VII-VII of the plane view shown in the upper side. Unlike the structure shown in FIG. 5 where each polysilicon layer 71 in the level shifter 613 is shared by 4 TFT elements 7, in the structure shown in FIG. 7, the polysilicon layer 71 is shared by 2 TFT elements 7, for convenience of explanation.

As shown in this figure, each TFT element 7 of the shift register 611 and each TFT element 7 of the level shifter 613 has the same structure since they are formed by the same process. Specifically, each TFT element 7 of the shift register 611 has a gate electrode 74 which opposes the channel region 711 of the polysilicon layer 71 with the insulating layer 721 interposed therebetween, a source/drain electrode 75 electrically connected onto the source/drain region 713 of the polysilicon layer 71 through the contact hole 727. The contact hole 727 is formed in the interlayer insulating film 723 covering the gate electrode 74 and the insulating layer 721. Here, the area 'Su' of gate covered region 'Au' (the region of the polysilicon layer 71 which opposes one gate electrode 7) is almost same in both of the shift register 611 and the level shifter 613. However, the number of gate electrode 74 formed on the polysilicon layer 71 in the shift register 611 and in the level shifter 613 are different from each other. More specifically, as shown in FIG. 7, while two gate electrodes 74 of TFT elements 7 are formed on one polysilicon layer 71 in the level shifter 613, four gate electrodes 74 of TFT elements 7 are formed on one polysilicon layer 71 in the shift register 611. Therefore, the gate covered total area 'S' of each polysilicon layer 71 in the level shifter 613 becomes smaller than the gate covered total area 'Ss' (=area 'Su' of gate covered region 'Au'×'the number of the TFT element 7 sharing one polysilicon layer 71') of each polysilicon layer 71 in the shift register 611.

As shown in FIG. 4, in the level shifter 613, a wiring for supplying the high level potential VGH and the low level potential VGL of a power supply is formed and the potential difference inside a circuit is comparatively large. On the other hand, as shown in FIG. 3, since the shift register 611 processes only a logic level signal whose voltage amplitude is smaller than a driving level, the inside potential difference is smaller than that of the level shifter 613. Meanwhile, the larger the voltage amplitude of a signal subject to processing by a circuit, the higher the tendency of TFT elements of the circuit suffering an electrostatic discharge. Therefore, when the polysilicon layer 71 in the level shifter 613 is shared by as same number of TFT element 7 as the level shifter 613, the gate covered total area 'S' increases and thus an electrostatic discharge in each TFT element 7 may not occur frequently. According to this embodiment, since the number (namely, number of the TFT element 7) of the gate electrode 74 sharing one polysilicon layer 71 in the level shifter 613 is less than that of the shift register 611, the gate covered total area 'S' of the polysilicon layer 71 in the level shifter 613 is smaller than the gate covered total area 'Ss' of the polysilicon layer 71 in the shift register 611. Therefore, an electrostatic discharge in each TFT element 7 constituting the level shifter 613 can be effectively prevented. Moreover, according to this embodiment, since the gate covered total area 'S' of the polysilicon layer 71 in the level shifter 613 is 3000 $\mu m^2$ or less like as the first embodiment, the electrostatic discharge in each TFT element 7 can be more certainly prevented. On the other hand, compared to a structure where one polysilicon layer 71 is arranged for every TFT element 7, since one polysilicon layer 71 in the shift register 611 is share by a plurality of TFT elements 7, the space for circuit arrangement can be reduced by decreasing the pitch of each TFT element 7.

C: Modification

Various modifications may be possible for the present invention and some of them will be described below.

(1) In above-mentioned embodiments, a structure in which one polysilicon layer 71 is shared by a plurality of TFT elements 7 (namely, a structure in which a plurality of gate electrodes 74 oppose one polysilicon layer 71) is disclosed, but another structure in which each polysilicon layer 71 is formed for every TFT elements 7 may be employed. Moreover, in the above-mentioned first embodiment, one polysilicon layer 71 is formed independently for every 4 TFT elements 7 constituting one unit circuit U, but the number of the TFT element 7 sharing one polysilicon layer 71 is not restricted thereto but can be selected arbitrarily. For example, m unit circuits U can be divided into 2 through m/2 or less blocks and then each polysilicon layer 71 can be disposed for every each block and spaced from each other.

(2) In the above-mentioned second embodiment, the gate covered total area 'S' of the level shifter 613 is adjusted so as to be smaller than the gate covered total area 'Ss' of the shift register 611 by regulating the number of the TFT element 7 sharing one polysilicon layer 71. However, instead of or combining with such structure, it is also be possible to make the area 'Su' of the polysilicon layer 71 opposing one gate electrode 74 (namely, gate covered region 'Au') differ between in the level shifter 613 and in the shift register 611. For example, although the number of the TFT element 7 sharing one polysilicon layer 71 is same in the shift register 611 and in the level shifter 613, when the area 'Su' of the gate covered region 'Au' in the level shifter 613 is smaller than the area 'Su' of the gate covered region 'Au' in the shift register 611, then the gate covered total area 'S' in the level shifter 613 comes to be smaller than the gate covered total area 'Ss' in the shift register 611, and thus the same effect as the above-mentioned first embodiment can be achieved.

(3) In the above-mentioned embodiments, a structure capable of decreasing the gate covered total area 'S' in the level shifter 613 constituting the scanning line driving circuit 61 is disclosed, but such structure is not restricted to the level shifter 613 of the scanning line driving circuit 61. For example, the gate covered total area 'Ss' constituting the shift register 611 of the scanning line driving circuit 61 also may be adjusted to 3000 $\mu m^2$ or less. In addition, for TFT elements 7 constituting each circuit of the data line driving circuit 62 (for example, a shift register, a sampling circuit, etc.), same condition as mentioned in the above embodiments can be applicable.

(4) This invention may be applied also to an electro-optical device using an electro-optical substance other than a liquid crystal. For example, the present invention may be applied to a display device using an organic EL (Electro Luminescent) or an organic light-emitting diode (OLED) element composed of a light-emitting polymer and so on, as an electro-optical element; a plasma display panel using a high-pressure gas, such as helium and neon, as an electro-optical substance; a field emission display device using a fluorescent substance as an electro-optical substance; an electrophoresis display device using a microcapsule containing a colored liquid and a white particle dispersed in the colored liquid as an electro-optical substance; a twist ball display device using a twist ball allotting a different color to every region with a different polarity as an electro-optical substance; or a toner display device using a black toner as an electro-optical substance. Like this, the electro-optical device according to this invention means a device (typically, a device for displaying a picture) using an electro-optical substance which changes electric energy such as current and voltage into an optical property such as permeability and brightness.

D: Electronic Apparatus

Figure 8:
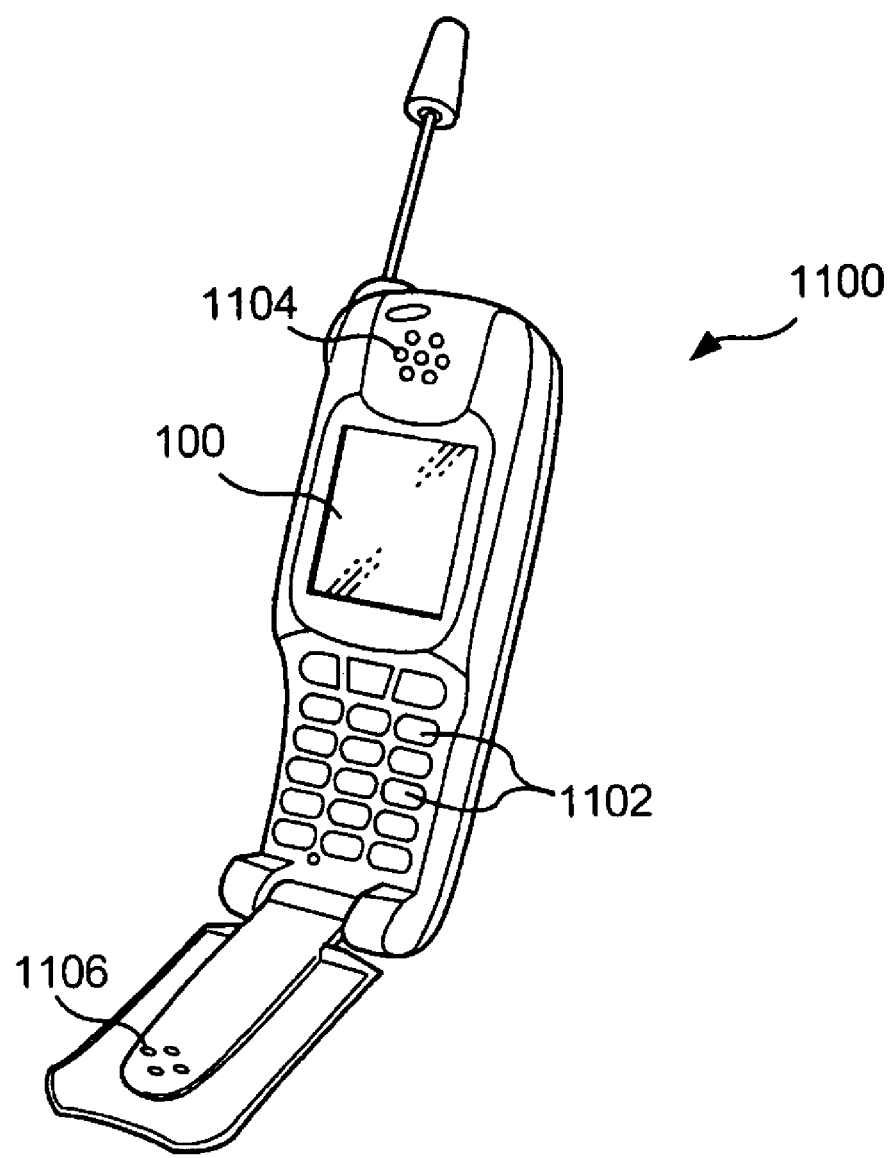
FIG. 8 is a perspective view showing a structure of a personal computer as an example of an electronic apparatus comprising an electronic device according to the present invention.

Next, the electronic apparatus employing an electro-optical device according to this invention as a display means will be described below. FIG. 8 is a perspective view showing a structure of a mobile phone comprising a liquid crystal device 100 according to the above-mentioned embodiment. As shown in this figure, a mobile phone 1100 has a plurality of operation buttons 1102 operated by a user, an ear piece 1104 for outputting a sound received from another terminal device, and a mouth piece 1106 for inputting a sound which is supposed to be transmitted to another terminal, and a liquid crystal device 100 for displaying various kinds of pictures.

As an electronic apparatus employing an electro-optical device according to the present invention, a mobile phone shown in FIG. 8, a note-type personal computer, a liquid crystal television and a view finder type (or monitor-direct-view-type) video tape recorder, a car navigation device, a pager, an electronic organizer, an electronic calculator, a calculator, a word processor, a workstation, a video phone, a POS terminal, and an apparatus having a touch panel may be exemplified.

What is claimed is:

1. An electro-optical device, comprising:
a substrate on which a plurality of pixels are arranged; and
a driving circuit for generating driving signals to drive the plurality of pixels respectively, by using a plurality of transistors formed on a surface of the substrate,
wherein each of the plurality of transistors has a gate electrode opposing a channel region of a polysilicon layer with an insulating layer interposed therebetween, the channel regions of the polysilicon layers being separated from each other, in at least one of the transistors,
the total area of the channel regions of the polysilicon layers which oppose the gate electrode of the at least one transistor is 3000 $\mu m^2$ or less, and
a level shift circuit for generating a signal with a larger voltage amplitude than that of an input signal by using the plurality of transistors, and for outputting the signal to each pixel as the driving signal, wherein
the level shift circuit includes m unit circuits (m is a natural number equal to or greater than 2) which are arranged in the pixel arrangement direction and each of which outputs the driving signal, and
the polysilicon layers of the level shift circuit are separated from each other, in every block which divides m unit circuits into 2 through m/2.

2. An electro-optical device comprising:
a substrate on which a plurality of pixels are arranged;
a shift register circuit which sequentially shifts a pulse signal in accordance with a clock signal by using a plurality of transistors formed on a surface of the substrate and outputs the pulse signal; and
a level shift circuit which generates, by using the plurality of transistors formed on the surface of the substrate, a signal with a larger voltage amplitude than that of the signal output from the shift register circuit, and then outputs it as a driving signal to each pixel,
wherein, each of the transistors of the shift register circuit and the level shift circuit has a gate electrode opposing a channel region of a polysilicon layer with an insulating layer interposed therebetween, the channel region of the polysilicon layers being separated from each other, in at least one of the transistors, and
the total area of the channel regions of the polysilicon layers which oppose the gate electrodes of the at least one transistor formed on each polysilicon layer in the level shift circuit is smaller than the total area of the channel regions of the polysilicon layers which oppose the gate electrodes of the at least one transistor formed on each polysilicon layer in the shift register circuit.

3. The electro-optical device according to claim 2, wherein, the total area of the channel regions of the polysilicon layers opposing the gate electrodes of one or more transistors formed on each polysilicon layer in the level shift circuit is 3000 $\mu m^2$ or less.

4. An electronic apparatus comprising an electro-optical device according to claim 1 as display means.

5. A driving circuit of an electro-optical device, for generating a driving signal for driving each pixel of the electro-optical device, by using a plurality of transistors formed on a surface of a substrate,
wherein each of the plurality of transistors has a gate electrode opposing a channel region of a polysilicon layer with an insulating layer interposed therebetween, the channel regions of the polysilicon layers being separated from each other, in at least one of the transistors, and
the total area of the channel regions of the polysilicon layers which oppose the gate electrodes of the at least one transistor is 3000 $\mu m^2$ or less, and comprising:
a level shift circuit for generating a signal with a larger voltage amplitude than that of an input signal by using the plurality of transistors, and for outputting the signal to each pixel as the driving signal, wherein
the level shift circuit includes m unit circuits (m is a natural number equal to or greater than 2) which are arranged in the pixel arrangement direction and each of which outputs the driving signal, and
the polysilicon layers of the level shift circuit are separated from each other, in every block which divides m unit circuits into 2 through m/2.

6. A driving circuit of an electro-optical device for generating a driving signal for driving each of a plurality of pixels of the electro-optical device, comprising:
a shift register circuit which sequentially shifts a pulse signal in accordance with a clock signal, by using a plurality of transistors formed on the surface of a substrate, and outputs the pulse signal; and
a level shift circuit which generates, by using the plurality of transistors formed on the surface of the substrate, a signal with a larger voltage amplitude than that of the signal output from the shift register circuit, and then outputs the signal as a driving signal to each pixel,
wherein, each transistor of the shift register circuit and the level shift circuit has a gate electrode opposing a channel region of a polysilicon layer with an insulating layer interposed therebetween, the channel regions of the polysilicon layer being separated from each other, in at least one of the transistors, and
the total area of the channel regions of the polysilicon layers which oppose the gate electrodes of the at least one transistor formed on each polysilicon layer in the level shift circuit is smaller than the total area of a region of the polysilicon layer which opposes the gate electrodes of the at least one transistor formed on each polysilicon layer in the shift register circuit.

7. An electro-optical device, comprising:
a substrate on which a plurality of pixels are arranged;
a driving circuit for generating driving signals to drive the plurality of pixels respectively, by using a plurality of transistors formed on a surface of the substrate;
a level shift circuit for generating a signal with a larger voltage amplitude than that of an input signal by using the plurality of transistors, and for outputting the signal to each pixel as the driving signal,
wherein each of the plurality of transistors has a gate electrode opposing a channel region of a polysilicon layer with an insulating layer interposed therebetween, the channel regions of the polysilicon layers being separated from each other, in at least one of the transistors,
the total area of the channel regions of the polysilicon layers which oppose the gate electrode of the at least one transistor is 3000 $\mu m^2$ or less, and the insulating layer has a thickness between 50 nm and 100 nm using an insulating material having a dielectric constant of 4 or less,
the level shift circuit includes m unit circuits (m is a natural number equal to or greater than 2) which are arranged in the pixel arrangement direction and each of which outputs the driving signal, and
the polysilicon layers of the level shift circuit are separated from each other, in every block which divides m unit circuits into 2 through m/2.

* * * * *